United States Patent [19]

Williams et al.

[11] Patent Number: 5,015,970

[45] Date of Patent: May 14, 1991

[54] CLOCK RECOVERY PHASE LOCK LOOP HAVING DIGITALLY RANGE LIMITED OPERATING WINDOW

[75] Inventors: Bertrand J. Williams, Campbell; Ronald L. Treadway, Saratoga, both of Calif.

[73] Assignee: Advanced Micro Devices, Inc., Sunnyvale, Calif.

[21] Appl. No.: 481,449

[22] Filed: Feb. 15, 1990

[51] Int. Cl.[5] ..................... H03L 7/087; H03L 7/089
[52] U.S. Cl. ..................................... 331/11; 307/516;
307/526; 328/134; 331/1 A; 331/17; 331/27
[58] Field of Search ..................................... 331/10–12,
331/17, 25, 27, 1 A

[56] References Cited

U.S. PATENT DOCUMENTS

| | | | |
|---|---|---|---|
| 3,610,954 | 10/1971 | Treadway | 307/232 |
| 4,339,731 | 7/1982 | Adams | 331/1 A |
| 4,565,976 | 1/1986 | Campbell | 331/57 |
| 4,686,481 | 8/1987 | Adams | 328/133 |

FOREIGN PATENT DOCUMENTS 2573592  5/1986  France .
2588433  4/1987  France .

OTHER PUBLICATIONS

Llewellyn et al, "A 33 Mb/s Data Synchronizing Phase-Locked-Loop Circuit", 1988 IEEE International Solid-State Circuits Conference, Feb. 17, 1988, pp. 12-13, 276, 277.

*Primary Examiner*—Siegfried H. Grimm
*Attorney, Agent, or Firm*—Fliesler, Dubb, Meyer & Lovejoy

[57] ABSTRACT

A PLL architecture is disclosed which incorporates a coarse adjustment feedback loop and a fine adjustment feedback loop together providing a combined error signal to a single VCO. The coarse adjustment feedback loop includes two digital counters set to divide the VCO output frequency by two different numbers. The outputs of the counters are coupled to the inputs of respective phase-frequency detectors, and the pump-up output of one of the detectors and the pump-down output of the other detector are used as the coarse adjustment pump-up and pump-down signals, respectively, in the coarse adjustment feedback loop. The coarse adjustment feedback loop thereby establishes a frequency range limitation for the fine adjustment feedback loop.

25 Claims, 5 Drawing Sheets

CLOCK RECOVERY PHASE LOCK LOOP HAVING DIGITALLY RANGE LIMITED OPERATING WINDOW

BACKGROUND OF THE INVENTION

1. Field of the Invention

The invention relates to phase-look loop architectures, and more particularly to range limited frequency centering clock recovery apparatus.

2. Description of the Related Art

In many types of signal transmission schemes, signals are transmitted as a self-clocking string of ones and zeros. That is, the string has logic level transitions occurring at least a specified number of times within a limited number of bit cells so that the data string contains a significant clock frequency component which is separable from the data information. One example of such a self-clocking data transmission scheme is the FDDI standard, which ensures at least one edge transition per 10 bit cells.

Apparatus for deriving the clock signal from such strings must effectively operate in the presence of noise and jitter, yet must be able to follow permitted frequency variations reliably. In FDDI systems, for example, the clock frequency of incoming data signals is permitted to vary by 50 ppm above or below the nominal frequency of 125MHz.

Many self-clocking communications systems, of which FDDI is one example, operate intermittently, that is, in stop-and-start applications. Packets of encoded information occur at random intervals, so there are many time intervals when a signal line is inactive and has only random or impulse noise signals present. A conventional analog phase-looked loop receiver operating under such conditions has difficulty operating because fast acquisition requires wide loop bandwidths while operation with noisy signals requires narrow loop bandwidths.

In Campbell, U.S. Pat. No. 4,565,976, there is disclosed a clock recovery apparatus using two phase-lock loops. Each loop has its own voltage controlled oscillator (VCO) with its output coupled to one input of a respective phase detector. The first phase-lock loop phase detector locks to the frequency of the system reference signal, and the phase detector output is used as a control voltage for the first phase-lock loop. This control voltage is also used as an additional control voltage in the second phase-look loop. The second phase-look loop has its own voltage controlled oscillator and phase detector, which receives the incoming data signal. The output of the second phase detector is a control voltage for the phase of the second VCO. As mentioned above, the second VCO also receives another voltage control signal from the first phase-lock loop. Thus, the second VCO receives two control signals, one constraining its frequency to be near that of the system reference signal and the second being used to control the phase and fine-tuned frequency of the second phase-lock loop to be that of the received signal. The Campbell apparatus is referred to as a type of range-limited clock recovery circuit.

The apparatus of the Campbell patent works well, but requires that the gain of the two VCOs be well matched. If the two VCOs are not sufficiently well matched, then the VCO of the first phase-lock loop may center the second phase-lock loop at a frequency which is not close enough to the clock frequency of the incoming data signal. In such a situation, the clock recovery apparatus may require longer than the maximum available time period to look onto the incoming clock frequency, or it may not be able to capture the incoming clock frequency at all. The need for well-matched VCOs places a premium on process invariance, thereby reducing yields.

In LLewellyn, et al., 1988 IEEE International Solid-State Circuits Conference, Digest of Technical Papers, pp. 12-13 and 276-277, there is described a frequency discriminating feedback loop that regulates the VCO control voltage and thus the operating frequency, preventing unbounded variations. A reference PLL, with a VCO ring oscillator supposedly identical to that of a primary PLL, is locked to a reference frequency. A comparator block has been included to sense when the primary oscillator control current crosses current thresholds placed symmetrically above and below the reference current. If either threshold is crossed, the comparator forces a correction at the primary PLL phase comparator, preventing further VCO control voltage excursions. Like Campbell, however, this range limited circuit still uses two VCOs and for at least that reason has limitations similar to those of Campbell.

SUMMARY OF THE INVENTION

In an aspect of the present invention, a single VCO is used simultaneously in a coarse adjustment phase-lock loop and fine adjustment phase-look loop. The coarse adjustment loop receives the frequency reference signal, and operates as a range control on the fine adjustment loop, which receives the incoming data signal. A summing filter is provided to combine the pump-up and pump-down signals from the two loops before presentation to the control input of the VCO.

In another aspect of the invention, counter apparatus is provided in a phase-lock loop feedback path which generates two frequency divided feedback signals: one divided by $(N-A)$ and the other divided by $(N+B)$, $N>1$, $0<A<N$ and $0<B<N$. Typically, for an optimized application, $A=B=1$. The frequency detection apparatus in the feedback loop compares the reference signal to both of the feedback signals. It generates its pump-up signal only when the higher frequency feedback signal falls below the reference frequency and generates its pump-down signal only when the lower frequency feedback signal rises above the reference frequency. These pump-up and pump-down signals are filtered and used to control the VCO. In this way the frequency output of the VCO is range limited by the frequency divider apparatus. If the frequency divider apparatus is made up of digital counters, the PLL frequency range limitation can be adjusted merely by digitally adjusting the count at which each counter resets.

BRIEF DESCRIPTION OF THE DRAWINGS

The invention will be described with respect to particular embodiments thereof, and reference will be made to the drawings, in which.

DETAILED DESCRIPTION

Figure 1:
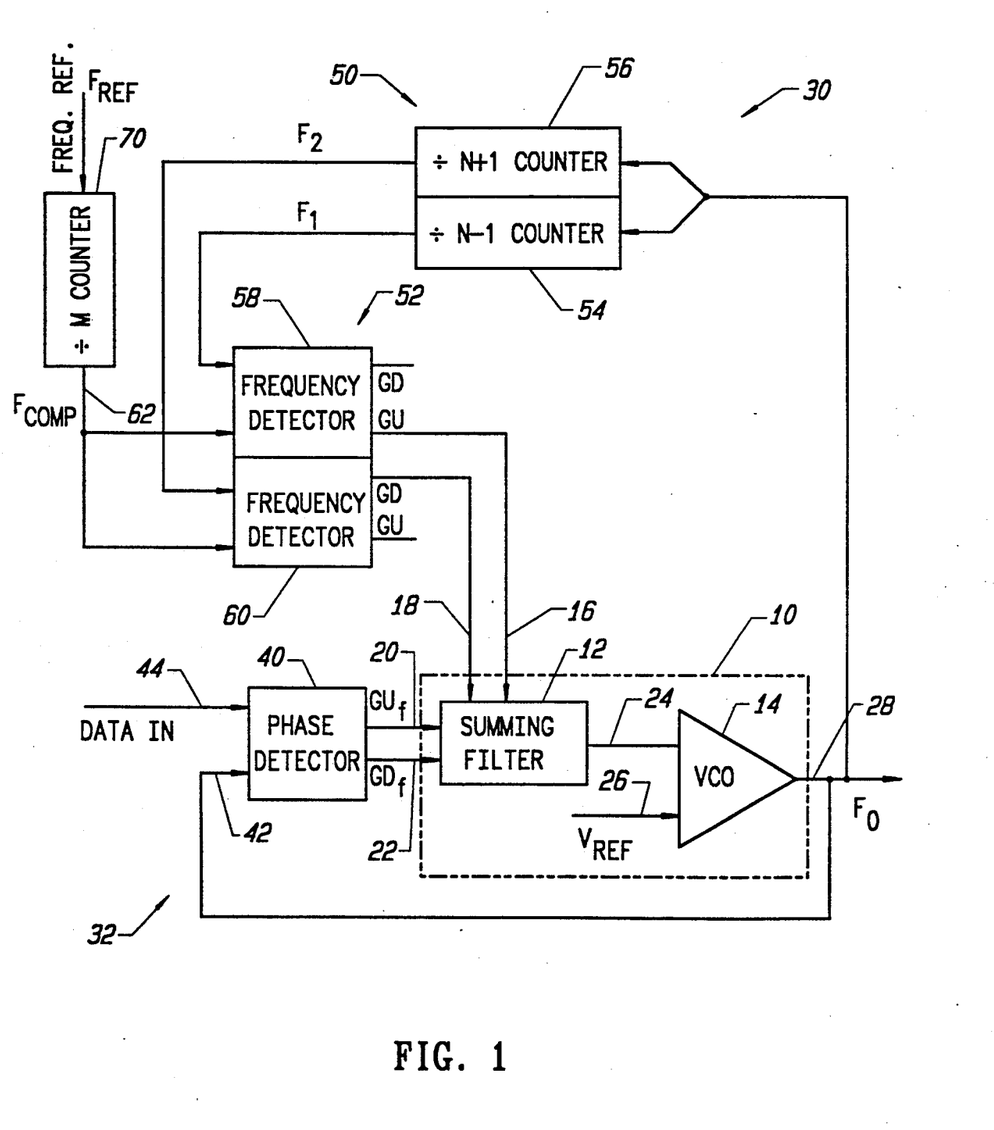
FIG. 1 is a block diagram of a digital range controlled PLL architecture incorporating aspects of the invention.

In FIG. 1 there is shown clock recovery apparatus which incorporates features of the present invention. It includes a clock signal generator 10 made up of a summing filter 12 and a VCO 14. The summing filter 12 has a coarse adjustment pump-up input 16, a coarse adjustment pump-down input 18, a fine adjustment pump-up input 20 and a fine adjustment pump-down input 22, and generates a control signal 24 for the VCO 14. A voltage reference signal 26 is also provided to the VCO 14, though this signal may not be necessary for some VCO designs.

The frequency output of the clock signal generator 10 is controlled by two simultaneous phase-lock loops: a coarse adjustment loop 30 and a fine adjustment loop 32. The fine adjustment loop is conventional, and includes a phase detector 40 having a feedback signal input 42 coupled to receive the output 28 of the clock signal generator 10, and a reference signal input 44 coupled to receive the incoming data signal. The pump-up and pump-down outputs of phase detector 40 are connected, respectively, to the fine adjustment pump-up input 20 and fine adjustment pump-down input 22 of summing filter 12 in clock signal generator 10.

The terms pump-up and pump-down, though originally associated with charge pump filter structures, are now often used to refer to any error signal which indicates that the oscillator frequency should be increased or decreased, respectively. This application uses the terms in the latter sense.

Also, as used herein, a frequency detector is a frequency sensitive circuit which may also preserve some phase information. For example, a circuit which compares the number of edges which appear on its two inputs and generates an error signal in proportion to the difference between the number of edges is inherently a frequency detector. In most designs, however, phase information is also preserved. A phase detector is a phase sensitive circuit which may also preserve some frequency information. For example, a circuit which compares the phase of edges appearing on a clock input to the phase of edges which appear on the other input, when they are present, would be a phase detector. This type of circuit also preserves some frequency information for small frequency ranges, interpreted as a phase difference. Large frequency differences will not be preserved since they will simply be interpreted as missed edges. The term phase-frequency detector (PFD) is a term which does not distinguish between phase and frequency sensitivity, and includes both frequency detectors and phase detectors.

The coarse adjustment feedback loop 30 in FIG. 1 comprises frequency divider apparatus 50 and PFD apparatus 52. Instead of constituting a single counter, however, frequency divider apparatus 50 includes two counters 54 and 56. The inputs of both are coupled to receive the clock signal generator output 28, but counter 54 divides by a value $N-1$ while counter 56 divides by the value $N+1$. For example, if $N=100$, then counter 54 will divide by 99 while counter 56 will divide by 101. Similarly, PFD apparatus 52 is made up of two frequency detectors 58 and 60. The reference frequency input of both frequency detectors 58 and 60 are connected to receive a frequency comparison signal 62, but the feedback input of frequency detector 58 is coupled to receive the output of counter 54 while the feedback input of frequency detector 60 is coupled to receive the output of counter 56. The pump-up output of frequency detector 58 is coupled to the coarse adjustment pump-up input 16 of summing filter 12 in clock signal generator 10, and the pump-down output of frequency detector 60 is coupled to the coarse adjustment pump-down input of summing filter 12 in clock signal generator 10. If the frequency detector 58 includes a pump-down output, it is ignored, as is any pump-up output of frequency detector 60.

A divide by M counter 70 (typically referred to as a prescaler) is also provided. The input of divide by M counter 70 is coupled to receive the frequency reference signal, for example from a crystal oscillator, and the output provides the frequency comparison signal 62.

In a typical application of the clock recovery apparatus of FIG. 1, for example, in FDDI applications, the nominal output frequency $F_{nom}$ may be 125MHz. In this case, N may be equal to 100 and M may be equal to 10, thereby permitting the frequency reference oscillator (not shown) to operate at a relatively low frequency $F_{ref} = 12.5$MHz.

In general operation, it will be seen that the coarse feedback loop 30 constrains the clock signal generator 10 to operate within a window of 1% above or below the nominal clock frequency $F_{nom} = 125$MHz, thereby permitting the fine adjustment feedback loop 32 to more easily capture and hold the clock frequency of the incoming data signal. In particular, if the current output signal of the VCO 14 has a frequency $F_o$, the counter 54 will generate a signal on its output having a frequency $F_1 = F_o/99$ and counter 56 will generate on its output a signal having a frequency $F_2 = F_o/101$. For example, if $F_o$ happens to be exactly equal to 125MHz, then $F_1$ will equal 1.2625MHz and $F_2$ will equal 1.2375MHz. These signals are provided to the feedback inputs of the frequency detectors 58 and 60, respectively.

Since $M=10$ and the frequency reference signal has a frequency $F_{ref} = 12.5$MHz, the counter 70 will generate on its output 62 a frequency comparison signal having a frequency $F_{comp} = 12.5$MHz/$10 = 1.25$MHz. This signal is provided to the reference inputs of both frequency detectors 58 and 60. Thus, if the VCO 14 is operating at exactly the nominal frequency $F_{nom} = 1.25$MHz, then frequency detector 58 will be comparing the frequency comparison frequency $F_{comp} = 1.25$MHz to the smaller frequency $F_1 = 1.237$MHz while the frequency detector 60 will be comparing $F_{comp} = 1.25$MHz to the larger frequency signal $F_2 = 1.263$MHz. In this situation, therefore, the pump-down output of frequency detector 58 will always be active while the pump-up output will be inactive. Similarly, the pump-up output of frequency detector 60 will be active while the pump-down output will be inactive. Only the pump-up output of frequency detector 58 and the pump-down output of frequency detector 60 have any effect on clock signal generator 10. It can be seen that only if $F_1$ falls below $F_{comp}$, or $F_2$ rises above $F_{comp}$, will the pump-up or pump-down outputs of the PFD apparatus 52 be active and operate on the clock signal generator 10 to bring the output frequency $F_o$ back within the predetermined range. Thus, the coarse feedback loop 30 will control clock signal generator 10 to have a frequency range of 125MHz±1%.

It will be understood that though a nominal frequency of $F_{nom}=125$MHz is used in this example, other frequencies will also work. Additionally, in a more general illustration of the present invention, the counters 54 and 56 may be divide-by (N-A) and divide-by (N+B) counters, $0<A<N$ and $0<B<N$, instead of divide by ($N\pm 1$) counters. In this case, the coarse adjustment loop 30 will maintain the output frequency $F_o$ within the range $F_{ref}\times(N-A)/M$ and $F_{ref}\times(N+B)/M$. It is preferable that A and B be equal in order to center the window, however, and that A and B both equal 1 in order to keep the window as narrow as possible. However, neither of these conditions is essential to the broadest aspects of the invention.

Phase detector 40 operates in a conventional manner within fine adjustment feedback loop 32. It compares the feedback signal 42 to the incoming data signal 44 to generate a fine adjustment pump-up signal if $F_o$ is less than the clock frequency of the incoming data signal, and to generate a fine adjustment pump-down signal if $F_o$ is greater than the clock frequency of the incoming data signal. It accomplishes this by comparing the phase of the two signals and generating the appropriate pump-up and pump-down signals until the phases match.

PFDs 58 and 60 are frequency detectors rather than phase detectors, in order to ensure a large capture range. On the other hand, PFD 40 is a phase detector rather than a frequency detector, in order to obtain the quickest and most accurate response possible to changes in the incoming data signal. Frequency capture range is less important for phase detector 40 since the coarse adjustment feedback loop already ensures that the VCO 14 will be operating at very close to the clock frequency of the incoming data signal.

The summing filter 12 in clock signal generator 10 combines the coarse and fine adjustment pump-up and pump-down signals in order to generate the control signal 24 for VCO 14. Roughly, it generates a signal responsive to the difference between a weighted sum of the coarse and fine adjustment pump-up signals and a weighted sum of the coarse and fine adjustment pump-down signals. The coarse adjustment pump-up and pump-down signals are preferably given less weight than the fine adjustment pump-up and pump-down signals, since the pulses in the coarse adjustment signals typically last many times longer than those of the fine adjustment signals.

Figure 2:
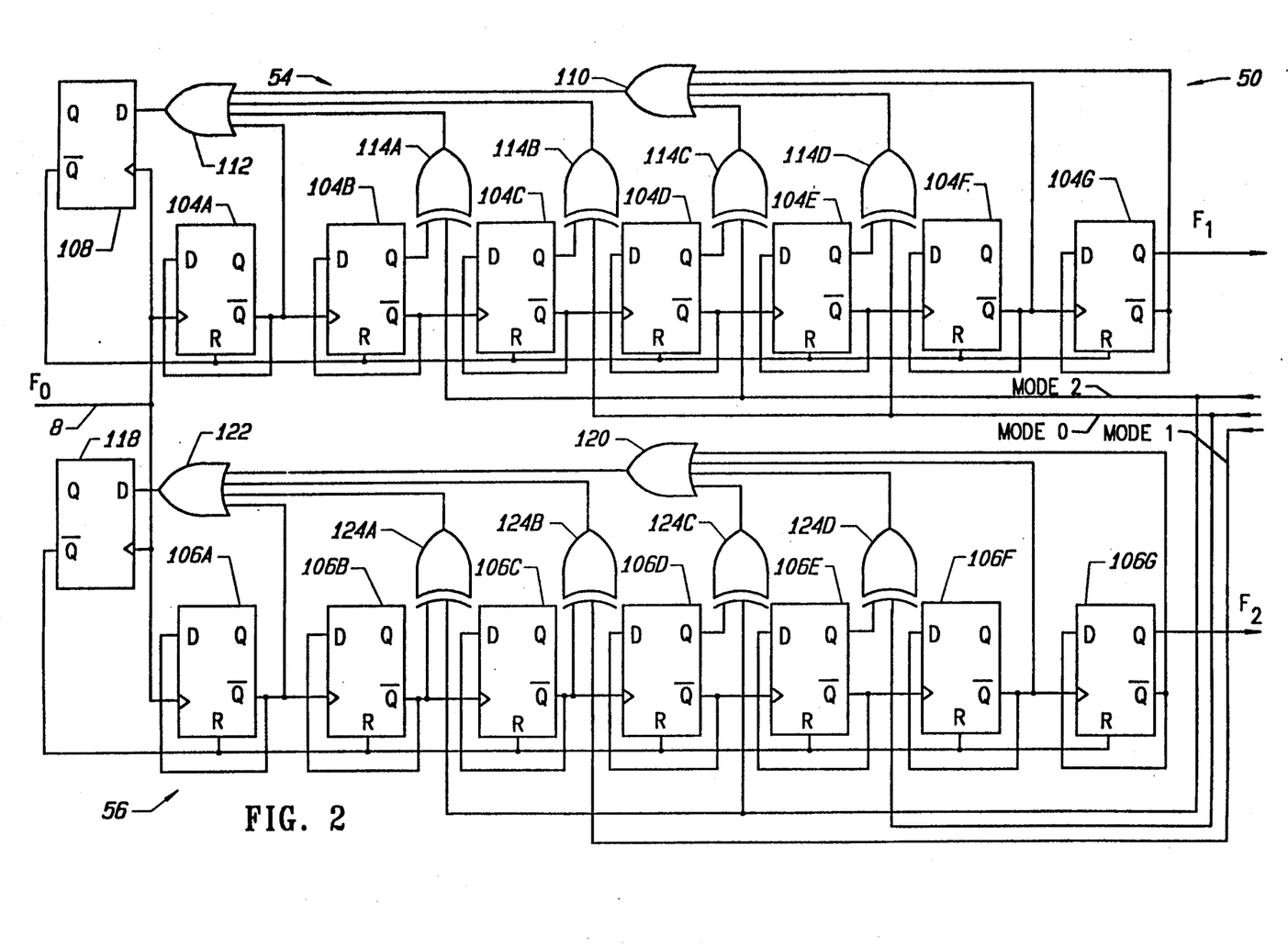
FIG. 2 is a detail drawing of the frequency divider apparatus 50 of FIG. 1.

A detail of the frequency divider apparatus 50 is shown in FIG. 2. It consists basically of two conventional counters, and for that reason will not be described in detail. It further includes three mode lines, mode 0, mode 1 and mode 2. Prior circuitry, not shown, ensures that exactly one of these mode lines is high at any given time. Each of the signals in FIG. 2 are shown being carried on a single line, but it will be understood that many of these signals may be carried differentially on two physical conductors. The choice depends mainly on the fabrication technology to be used.

The frequency divider apparatus of FIG. 2, as illustrated in FIG. 1, comprises two basically separate counters 54 and 56. Counter 54 comprises seven D flip-flops 104a-104g, a reset flip-flop 108, two 4-input OR gates 110 and 112, and four XOR gates 114a, 114b, 114c and 114d. Similarly, counter 56 comprises seven D flip-flops 106a-106g, a reset D flip-flop 118, two 4-input OR gates 120 and 122, and four exclusive OR gates 124-124d.

In counter 54, each of the flip-flops 104a-104g has its D input connected differentially to its $\overline{Q}$ output. The clock input of each of the flip flops 104b-104g is connected differentially to the $\overline{Q}$ output of the previous flip-flop 104a-104f, respectively, and the clock input of flip-flop 104a is connected to receive the differential output 28 of VCO 14 (FIG. 1). Similarly, in counter 56, the D input of each of the flip-flops 106a-106g is connected differentially to the $\overline{Q}$ output of that flip-flop. The clock input of each of the flip-flops 106b-106g is connected differentially to $\overline{Q}$ output of the previous flip-flop 106a-106f, and the clock input of flip-flop 106a is connected to receive the differential output 28 of VCO 14.

In counter 54, reset flip-flop 108 has its D input connected to the output of OR gate 112, its clock input connected to the differential output 28 of VCO 14, and its $\overline{Q}$ output connected differentially to the reset input of each of the flip-flops 104a-104g. Similarly, in counter 56, the reset flip-flop 118 has its D input connected to the output of OR gate 122, its clock input connected to receive the differential output 28 of VCO 14, and its $\overline{Q}$ output connected differentially to the reset input of each of the flip-flops 106a-106g.

The frequency divider apparatus 50 includes three mode lines, mode 0, mode 1 and mode 2, for selecting the frequency range which coarse adjustment loop 30 (FIG. 1) will permit. Prior circuitry (not shown) ensures that exactly one of the mode lines is high at any given time. The mode 2 line is connected to one input of each of the exclusive OR gates 114a, 114c, 124a and 124c. The mode 0 line is connected to an input of each of the exclusive OR gates 114b, 114d and 124d. The mode 1 line is connected to an input of only exclusive OR gate 124b. The other input of exclusive OR gates 114a-114b in counter 54 are connected, respectively, to the Q outputs of flip-flops 104b-104e. In counter 56, the other input of exclusive OR gate 124a and 124b are connected to the $\overline{Q}$ outputs of respective flip-flops 106b and 106c, while the other inputs of exclusive OR gates 124c and 124d are connected to the Q outputs of respective flip-flops 106d and 106e.

In counter 54, the four inputs of OR gate 112 are connected, respectively, to the $\overline{Q}$ output of flip-flop 104a, the outputs of exclusive OR gates 114a and 114b, and the output of OR gate 110. The four inputs of OR gate 110 are connected, respectively, to the outputs of exclusive OR gates 114c and 114d, and the $\overline{Q}$ outputs of flip-flops 104f and 104g. In counter 56, OR gate 122 has its four inputs connected, respectively, to the $\overline{Q}$ output of flip-flop 106a, the outputs of exclusive OR gates 124a and 124b, and the output of OR gate 120. The four inputs of OR gate 120 are connected, respectively, to the outputs of exclusive OR gates 124c and 124d, and to the $\overline{Q}$ outputs of flip-flops 106f and 106g.

The operation of the frequency divider apparatus 50 shown in FIG. 2 is conventional and will not be described in detail here. It will be appreciated, however, that if mode 1 is high, the Q output of flip-flop 104g will undergo one complete cycle for every 99 cycles undergone by the signal on the VCO output 28, while the Q output of flip-flop 106g in counter 56 will undergo one complete cycle for every 101 cycles undergone by the VCO output 28. It can be seen that for the three modes, the counters divide the VCO output signal 28 by the values shown in Table I.

TABLE I

| MODE | COUNTER 54 | COUNTER 56 | N |
|---|---|---|---|
| 0 | ÷ 119 | ÷ 121 | 120 |
| 1 | ÷ 99 | ÷ 101 | 100 |
| 2 | ÷ 109 | ÷ 111 | 110 |

In other words, counters 54 and 56 divide the VCO output signal 28 by N±1, where N is as shown in Table I for the different modes. The mode may be made user-selectable or may be preset at the factory.

Figure 3:
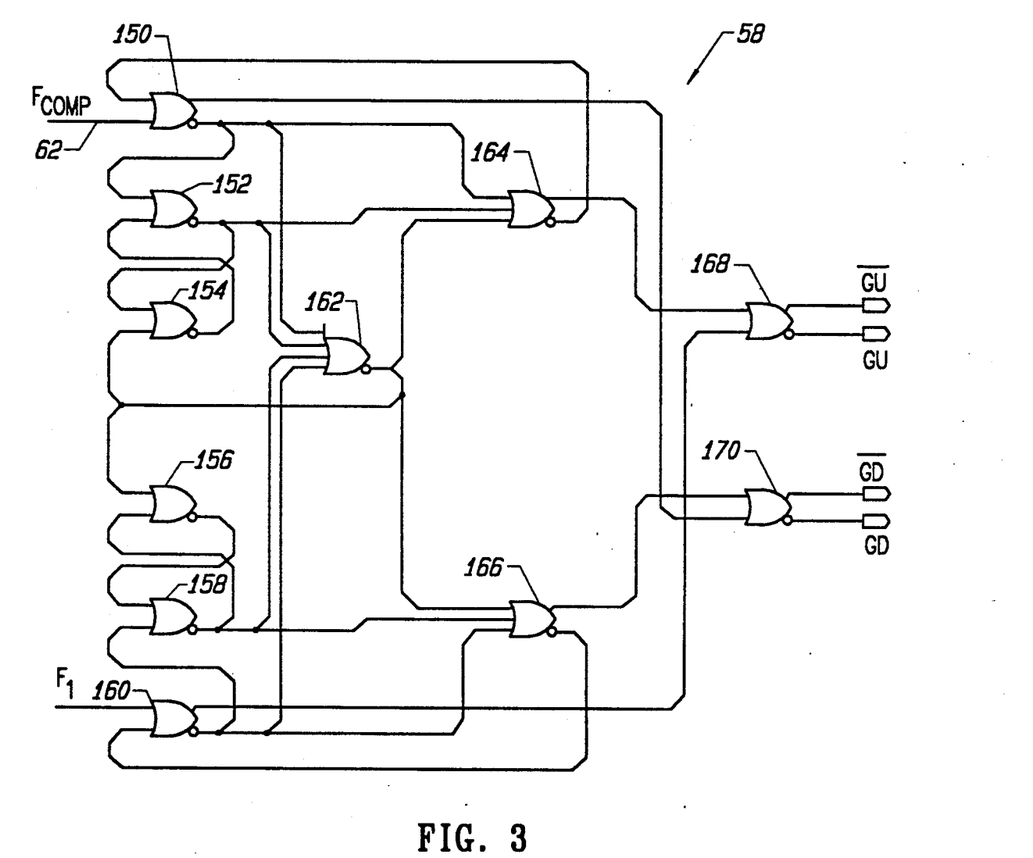
FIG. 3 is a detail drawing of one of the frequency detectors 58 in FIG. 1.

FIG. 3 is a detail of frequency detector 58 (FIG. 1). It is basically a modification of a well-known 9-gate phase-frequency detector, described in U.S. Pat. No. 3,610,954 and incorporated herein by reference. It consists of 11 OR gates connected as follows. OR gate 150 is coupled to receive the frequency comparison signal 62 from the divide by M counter 70 (FIG. 1) at one input. The inverting output of OR gate 150 is connected to one input of an OR gate 152, the inverting output of which is connected to an input of another OR gate 154. Inverting output of OR gate 154 is connected back to a second input of OR gate 152. The output of divide by (N−1) counter 54 is connected to one input of another OR gate 160, the inverting output of which is connected to one input of an OR gate 158, the inverting output of which is connected to one input of an OR gate 156. The inverting output of OR gate 156 is connected back to a second input of OR gate 158. The inverting outputs of OR gates 150, 152, 158 and 160 are all connected to respective inputs of a 4-input OR gate 162, the inverting output of which is connected to a second input of each of the OR gates 154 and 156. The inverting outputs of OR gates 150, 152 and 162 are all connected to respective inputs of a 3-input OR gate 164, and the inverting outputs of OR gates 162, 158 and 160 are all connected to respective inputs of a 3-input OR gate 166. The inverting output of OR gate 164 is connected back to a second input of OR gate 150, and the inverting output of OR gate 166 is connected back to a second input of OR gate 160. An OR gate 168 has two inputs coupled to receive the non-inverting output of OR gate 164 and the non-inverting output of OR gate 160, respectively, and another OR gate 170 has two inputs coupled to receive the non-inverting output of OR gate 166 and the non-inverting output of OR gate 150, respectively. OR gates 168 and 170 are added to filter unwanted glitches. The inverting and non-inverting outputs of OR gate 168 carry differentially the coarse adjustment pump-up signal 16 (FIG. 1). The inverting and non-inverting outputs of OR gate 170 differentially carry a pump-down signal, but this signal from frequency detector 58 is ignored. The operation of frequency detector 58 as shown in FIG. 3 will be apparent to a person of ordinary skill and will not be further explained here.

Frequency detector 60 is identical to frequency detector 58, except that in frequency detector 60 it is the pump-up output which is ignored. The differential pump-down output signal from OR gate 170 (FIG. 3) is the coarse adjustment pump-down signal 18 (FIG. 1). In frequency detectors 58 and 60, the OR gate which provides the signal which is ignored may be omitted if desired.

Figure 4:
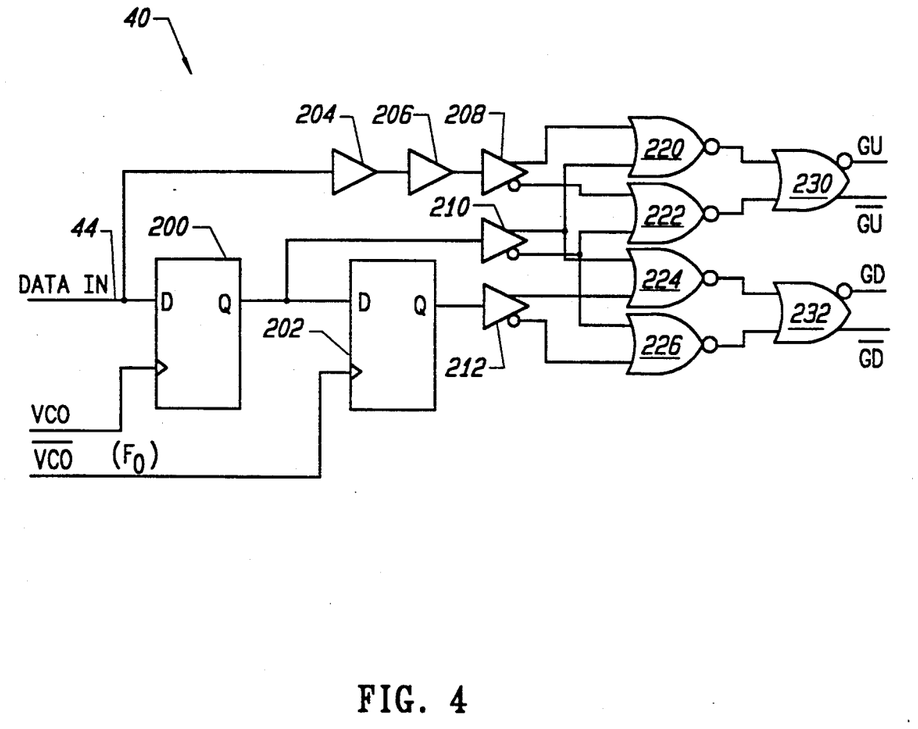
FIG. 4 is a detail drawing of the phase detector 40 in FIG. 1.

FIG. 4 shows a detail of the phase detector 40 in fine adjustment loop 32 (FIG. 1). The incoming data signal on line 44 is applied differentially to the D input of a D flip-flop 200, the Q output of which is connected to the D input of a second flip-flop 202. The output 28 of VCO 14 is differentially applied to the clock input of flip-flop 200, and is differentially applied in inverse to the clock input of flip-flop 202. The incoming data signal on line 44 is also provided differentially to a buffer 204, the output of which differentially feeds a second buffer 206, the output of which differentially feeds a third buffer 208. Buffers 204 and 206 are provided to match the clock-to-output delay of the flip-flop 200. Similarly, the Q output of flip-flop 200 differentially feeds a buffer 210, and the Q output of flip-flop 202 differentially feeds a buffer 212. A NOR gate 220 has two inputs which are connected to the true outputs of, respectively, buffers 208 and 210, and another NOR gate 222 has two inputs connected to the inverting outputs of, respectively, buffers 208 and 210. Similarly, a NOR gate 224 has its two inputs connected to the non-inverting outputs of, respectively, buffers 210 and 212, and a NOR gate 226 has two inputs connected to the inverting outputs of, respectively, buffers 210 and 212. NOR gates 220 and 222 are connected to two inputs of an OR gate 230, the inverting and true outputs of which provide the fine adjustment pump-up signal 20 (FIG. 1) as a differential signal. Similarly, the outputs of NOR gates 224 and 226 are connected to two inputs of an OR gate 232, the inverting and true outputs of which provide the fine adjustment pump-down signal 22 (FIG. 1) as a differential signal. The operation of phase detector 40 as shown in FIG. 4 is well known and will not be further described here.

Figure 5:
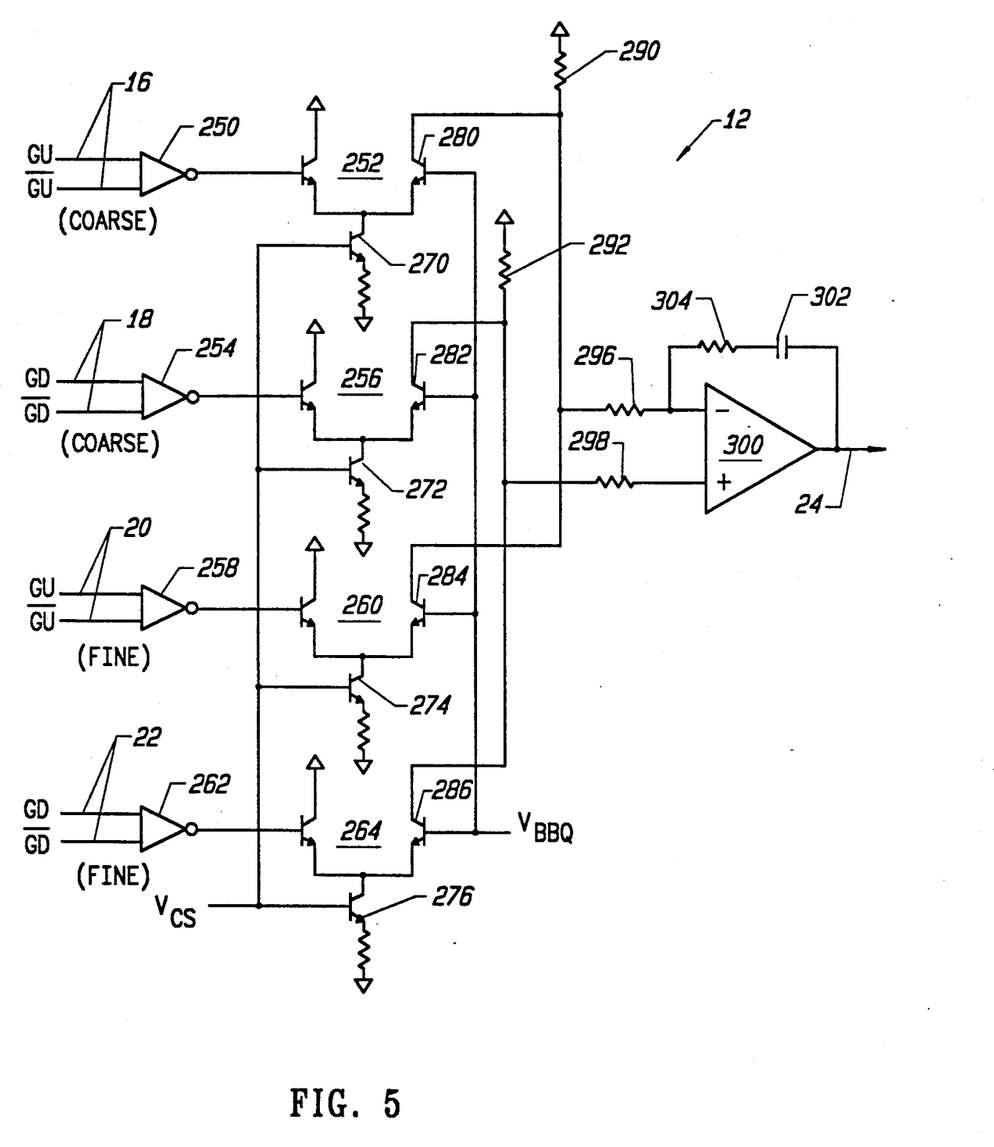
FIG. 5 is a detail drawing of the summing filter 12 in FIG. 1.

In FIG. 5 there is shown a detail of the summing filter 12 (FIG. 1). The coarse adjustment pump-up signal 16 is differentially applied to an inverting buffer 250, the output of which is connected to the input of a current switch 252. Similarly, the coarse adjustment pump-down signal 18 is differentially applied to an inverting buffer 254 the voltage output of which is connected to a current switch 256. The fine adjustment pump-up signal 20 is differentially applied to the input of an inverting buffer 258, the output of which is connected to the input of a current switch 260, and the fine adjustment pump-down signal 22 is differentially applied to an inverting buffer 262, the output of which is applied to the input of a current switch 264. The current source transistors 270, 272, 274 and 276 of the switches 252, 256, 260 and 264, respectively, have their bases all connected together and to a reference voltage $V_{cs}$. Similarly, the bases of the reference transistors 280, 282, 284 and 286 of respective switches 252, 256, 260 and 264 are all connected together and to another reference voltage $V_{BBQ}$. The bases of reference transistors 280, 282, 284 and 286 are connected to a reference voltage rather than to a non-inverting output of buffers 250, 254, 258 and 262, in order to avoid capacitive coupling from the buffer outputs to the sensitive input of the filter. The current outputs of current switches 252 and 260 are connected together and through a resistor 290 to $V_{cc}$. Similarly, the current outputs of current switches 256 and 264 are connected together and through a resistor 292 to $V_{cc}$. The current outputs of switches 252 and 260 are further connected through a resistor 296 to the inverting input of an op-amp 300, and the current outputs of switches 256 and 264 are connected through a resistor 298 to the non-inverting input of op-amp 300. The output of op-amp 300 is fed back to its inverting input via a filter capacitor 302 and a resistor 304. The output of op-amp 300 forms the control signal 24 applied to VCO 14 in the clock signal generator 10 (FIG. 1).

In operation, current switches 252 and 260 convert, respectively, the coarse and fine pump-up signals 16 and 20 to current signals, which are summed by the connection between the two current outputs of these switches and converted back to a voltage signal by resistor 290. Similarly, current switches 256 and 264, respectively, the coarse and fine pump-down signals 18 and 22 to current signals, which are summed by the connection between the two current outputs of these switches and converted back to a voltage signal by resistor 292. Op-amp 300 then takes the difference between the summed pump-up signal and the summed pump-down signal and filters higher-frequency components of this signal via capacitor 302. Thus, the voltage control signal 24 generated by summing filter 12 is responsive to the difference between a sum of the coarse and fine adjustment pump-up signals and a sum of the coarse fine adjustment pump-down signals.

As previously stated, the coarse adjustment signals may be weighted differently than the fine adjustment signals in these sums. This can be done in many ways in the summing filter of FIG. 5. One example would be to make the current output of the coarse switches different from the current output of the fine switches by adjusting the values of the emitter resistors on the current source transistor. In this way, the current output of switches 252 and 256 can be made smaller than the current output of switches 260 and 264, giving the fine adjustment signals 20 and 22 greater influence in the summations.

The invention has been described with reference to particular embodiments thereof, and it will be understood that numerous modifications may be made without departing from the invention. For example, such modifications can be due to different fabrication technologies, different circuit techniques, different circuit implementations, or different ways of representing various signals. As another example, a frequency divider or other components may be included in the fine adjustment feedback loop if desired, or a third, medium adjustment, feedback loop may be added. These variations and others are intended to be included within the scope of the invention.

What is claimed is:

1. Clock generating apparatus, for use with a frequency comparison input signal and generating a clock output signal, comprising:
    coarse adjustment feedback means for generating a first error signal if the frequency of said clock output signal divided by a predetermined value $N-A$ is less than the frequency of said frequency comparison input signal, and for generating a second error signal if the frequency of said clock output signal divided by a predetermined value $N+B$ is greater than said frequency of said frequency comparison input signal, $N>1$, $0>A>N$ and $0<B<N$; and
    clock signal generating means for increasing the frequency of said clock output signal in response to said first error signal and for decreasing the frequency of said clock output signal in response to said second error signal.

2. Apparatus according to claim 1, wherein said first and second error signals are on separate conductors, each carrying digital pulses having respective widths, the pulse width of said first error signal indicating the magnitude by which the frequency of said clock output signal divided by $(N-A)$ is less than the frequency of said frequency comparison input signal, and the pulse width of said second error signal indicating the magnitude by which the frequency of said clock output signal divided by $(N+B)$ is greater than the frequency of said frequency comparison input signal.

3. Apparatus according to claim 1, for use further with a data input signal, further comprising fine adjustment feedback means for generating a third error signal if the frequency of said clock output signal divided by a predetermined value P is less than the clock frequency of said data input signal, and for generating a fourth error signal if the frequency of said clock output signal divided by P is greater than the clock frequency of said data input signal, and wherein said clock signal generating means is further for increasing the frequency of said clock output signal in response to said third error signal and for decreasing the frequency of said clock output signal in response to said fourth error signal.

4. Apparatus according to claim 3, wherein $A=1$, $B=1$ and $P=1$.

5. Apparatus according to claim 1, wherein said coarse adjustment feedback means comprises:
    a first divide-by $(N-A)$ counter having an input coupled to receive said clock output signal and having an output;
    a second divide-by $(N+B)$ counter having an input coupled to receive said clock output signal and having an output;
    first phase-frequency detector means for comparing the frequency of the signal on said output of said first counter to the frequency of said frequency comparison input signal and generating said first error signal; and
    second phase-frequency detector means for comparing the frequency of the signal on said output of said second counter to the frequency of said frequency comparison input signal and generating said second error signal.

6. Apparatus according to claim 5, wherein N is adjustable.

7. Apparatus according to claim 3, wherein said clock signal generating means comprises:
    summing means for generating an oscillator control signal responsive to the difference between a first sum of said first and third error signals and a second sum of said second and fourth error signals; and
    controlled oscillator means for generating said clock output signal at a frequency responsive to said oscillator control signal.

8. Apparatus according to claim 7, wherein said first error signal is weighted less heavily than said third error signal in said first sum, and wherein said second error signal is weighted less heavily than said fourth error signal in said second sum.

9. Clock recovery apparatus, for use with a data input signal and a frequency comparison signal, and generating a clock output signal, comprising:
    fine adjustment feedback means, receiving said data input signal and said clock output signal, for generating a fine adjustment signal indicating whether the frequency of said clock output signal is above or below the frequency of said data input signal;
    controlled oscillator means for generating said clock output signal to have a frequency responsive to an oscillator control signal; and
    coarse adjustment and frequency control means, receiving said frequency comparison signal, said clock output signal and said fine adjustment signal, for generating said oscillator control signal to have a first value responsive to said fine adjustment signal if said frequency of said clock output signal is within a predetermined frequency window around the frequency of said frequency comparison signal, and a second value which causes said controlled oscillator means to generate said clock output signal to have a second frequency within said predetermined window, if said frequency of said clock output signal is outside said predetermined window.

10. Apparatus according to claim 9, wherein said coarse adjustment and frequency control means comprises:

coarse adjustment feedback means, receiving said frequency comparison signal and said clock output signal, for generating a coarse adjustment signal indicating whether said clock output signal is within said predetermined window; and summing means for generating said oscillator control signal responsive to a sum of said fine and coarse adjustment signals 11. Apparatus according to claim 10, wherein said fine adjustment signal comprises a fine adjustment pump-up signal and a fine adjustment pump-down signal, and wherein said coarse adjustment signal comprises a coarse adjustment pump-up signal and a coarse adjustment pump-down signal.

12. Apparatus according to claim 9, wherein said coarse adjustment and frequency control means comprises:

a first divide-by $(N-1)$ counter having an input coupled to receive said clock output signal and having an output, $N>1$;

a second divide-by $(N+1)$ counter having an input coupled to receive said clock output signal and having an ouput;

a first phase-frequency detector comparing the frequency of the signal on said output of said first counter to the frequency of said frequency comparison signal and generating a first error signal; and a second phase-frequency detector comparing the frequency of the signal on said output of said second counter to the frequency of said frequency comparison signal and generating a second error signal, said first and second error signals constituting said coarse adjustment signal, wherein said fine adjustment feedback means comprises:

a third phase-frequency detector comparing the frequency of said clock output signal to the clock frequency of said data input signal and generating a third error signal being said fine adjustment signal, said coarse adjustment and frequency control means further comprising:

summing means for generating said oscillator control signal responsive to said first, second and third error signals 13. Clock recovery apparatus for use with a data input signal and a frequency comparison signal, and generating a clock output signal, comprising:

a voltage controlled oscillator having an output carrying said clock output signal and further having a control input;

a fine adjustment phase-frequency detector having a first input coupled to receive said clock output signal and a second input coupled to receive said data input signal, said first phase-frequency detector further having a pump-up output and a pump-down output;

frequency divider apparatus having an input coupled to receive said clock output signal and further having first and second outputs, said divider apparatus generating on said first output of said divider apparatus a signal having a frequency of $1/(N-A)$ times the frequency of the signal on the input of said divider apparatus, and said divider generating on said second output of said divider apparatus a signal having a frequency of $1/(N+B)$ times the frequency of the signal on the input of said divider apparatus, $N>1$, $0>A>N$ and $0>B>N$;

coarse adjustment phase-frequency detector apparatus having a first input coupled to receive said first output of said divider apparatus, a second input coupled to receive said second output of said divider apparatus, a reference input coupled to receive said frequency comparison signal, a pump-up output indicating whether the frequency of the signal on said first input of said coarse adjustment phase-frequency detector apparatus is less than the frequency of the signal on said reference input of said coarse adjustment phase-frequency detector apparatus, and a pump-down output indicating whether the frequency of the signal on said second input of said coarse adjustment phase-frequency detector apparatus is greater than the frequency of the signal on said reference input of said coarse adjustment phase-frequency detector apparatus; and a summing filter having an output, coarse and fine pump-up inputs and coarse and fine pump-down inputs, said coarse pump-up input of said summing filter being coupled to said pump-up output of said coarse adjustment phase-frequency detector apparatus, said fine pump-up input of said summing filter being coupled to said pump-up output of said fine adjustment phase-frequency detector, said coarse pump-down input of said summing filter being coupled to said pump-down output of said coarse adjustment phase-frequency detector apparatus, said fine pump-down input of said summing filter being coupled to said pump-down output of said fine adjustment phase-frequency detector, and said output of said summing filter being coupled to said control input of said voltage controlled oscillator.

14. Apparatus according to claim 13, wherein said frequency divider apparatus comprises a first divide-by $(N-A)$ counter and a second divide-by $(N+B)$ counter, each having an input and an output, the input of each of said counters being coupled to receive the input of said frequency divider apparatus, the output of said first counter being said first output of said frequency divider apparatus and the output of said second counter being said second output of said frequency divider apparatus, and wherein said coarse adjustment phase-frequency detector apparatus comprises first and second phase-frequency detectors each having a feedback input, a reference input and an output, said reference inputs of said first and second phase-frequency detectors each being coupled to receive said reference input of said coarse adjustment phase-frequency detector apparatus, said feedback input of said first phase-frequency detector being coupled to receive said first input of said coarse adjustment phase-frequency detector apparatus and said feedback input of said second phase-frequency detector being coupled to receive said second input of said coarse adjustment phase-frequency detector apparatus, said output of said first phase-frequency detector being said pump-up output of said coarse adjustment phase-frequency detector apparatus and said output of said second phase-frequency detector being said pump-down output of said coarse adjustment phase-frequency detector apparatus.

15. Apparatus according to claim 13, further comprising a reference frequency divider having an input and an output, said input of said reference frequency divider being coupled to receive a frequency reference signal and said output of said reference frequency divider being coupled to provide said frequency comparison signal.

16. Apparatus according to claim 13, wherein N is adjustable.

17. Clock recovery apparatus for use with a data input signal and a frequency comparison signal, and generating a clock output signal, comprising:
a voltage controlled oscillator having an output carrying said clock output signal and further having a control input;
a fine adjustment phase detector having a feedback input coupled to receive said clock output signal and a reference input coupled to receive said data input signal, said fine adjustment phase detector further having a pump-up output and a pump-down output;
a first divide-by (N−1) frequency divider having an input and an output, said input of said first frequency divider being coupled to receive said clock output signal, N>1;
a second divide-by (N+1) frequency divider having an input and an output, said input of said second frequency divider being coupled to receive said clock output signal;
a first coarse adjustment frequency detector having feedback and reference inputs and having a pump-up output, said feedback input of said first coarse adjustment frequency detector being coupled to receive said output of said first frequency divider and said reference input of said first coarse adjustment frequency detector being coupled to receive said frequency comparison signal;
a second coarse adjustment frequency detector having a feedback input, a reference input and a pump-down output, said feedback input of said second coarse adjustment frequency detector being coupled to receive said output of said second frequency divider and said reference input of said second coarse adjustment frequency detector being coupled to receive said frequency comparison signal; and
a summing filter having coarse and fine pump-up inputs and coarse and fine pump-down inputs and having an output, said coarse pump-up input being coupled to receive said pump-up output of said first coarse adjustment frequency detector, said coarse pump-down input being coupled to receive said pump-down output of said second coarse adjustment frequency detector, said fine pump-up input being coupled to receive said pump-up output of said fine adjustment phase detector, said fine pump-down input of said summing filter being coupled to receive said pump-down output of said fine adjustment phase detector, and said output of said summing filter being coupled to said control input of said voltage controlled oscillator.

18. Apparatus according to claim 18, wherein N is adjustable.

19. Apparatus according to claim 18, wherein said summing filter comprises:
a first current switch having a voltage input coupled to receive said pump-up output of said first coarse adjustment frequency detector and having a current output;
a second current switch having a voltage input coupled to receive said pump-down output of said second coarse adjustment frequency detector and further having a current output;
a third current switch having a voltage input coupled to receive said pump-up output of said fine adjustment phase detector and further having a current output;
a fourth current switch having a voltage input coupled to receive said pump-down output of said fine adjustment phase detector and further having a current output;
a first resistor having a first terminal coupled to the current outputs of both said first and third current switches and having a second terminal coupled to a reference potential;
a second resistor having a first terminal coupled to the current outputs of both said second and fourth current switches and having a second terminal coupled to a reference potential; and
a differential filter having a first input coupled to said first terminal of said first resistor, a second input coupled to said first terminal of said second resistor, and an output being said output of said summing filter.

20. Apparatus according to claim 19, wherein the current output of said first current switch is less than the current output of said third current switch, and wherein the current output of said second current switch is less than the current output of said fourth current switch.

21. Apparatus according to claim 18, further comprising a reference frequency divider having an input and an output, said input of said reference frequency divider being coupled to receive a frequency reference signal and said output of said reference frequency divider being coupled to provide said frequency comparison signal.

22. Apparatus according to claim 9, wherein said coarse adjustment and frequency control means comprises:
coarse adjustment feedback means, receiving said frequency comparison signal and said clock output signal, for activating a coarse adjustment pump-up signal if said frequency of said clock output signal is below said predetermined window and for activating a coarse adjustment pump-down signal if said frequency of said clock output signal is above said predetermined window; and
summing means for generating said oscillator control signal as a time integration of a sum of said fine coarse adjustment signals, said coarse adjustment signals when active having strengths relative to said fine adjustment signal sufficient to substantially override said fine adjustment signal in said time integration.

23. Apparatus according to claim 22, wherein said coarse adjustment feedback means comprises:
first frequency detector means for activating said coarse adjustment pump-up signal if said frequency of said clock output signal is below said predetermined window; and
second frequency detector means for activating said coarse adjustment pump-down signal if said frequency of said clock output signal is above said predetermined window,
and wherein said fine adjustment feedback means comprises phase detector means for generating said fine adjustment signal,
said first and second frequency detector means being frequency sensitive and not otherwise phase sensitive, and said phase detector means being phase sensitive and not otherwise frequency sensitive.

24. Apparatus according to claim 9, wherein said second frequency is the highest frequency in said predetermined window if said frequency of said clock output signal is above said predetermined window, and wherein said frequency is the lowest frequency in said predetermined window if said frequency of said clock output signal is below said predetermined window.

25. Apparatus according to claim 5, for use further with a data input signal, wherein said first phase-frequency detector means comprises a frequency detector comparing the frequency of the signal on said output of said first counter to the frequency of said frequency comparison input signal, to generate said first error signal,
wherein said second phase-frequency detector means comprises a frequency detector comparing the frequency of the signal on said output of said second counter to the frequency of said frequency comparison input signal, to generate said second error signal,
said apparatus further comprising a fine adjustment phase detector generating a third error signal if the phase of a fine adjustment feedback signal responsive to said clock output signal lags the phase of said data input signal, and generating a fourth error signal if the phase of said fine adjustment feedback signal leads the phase of said data input signal,
and wherein said clock signal generating means is further for increasing the frequency of said clock output signal in response to said third error signal and for decreasing the frequency of said clock output signal in response to said fourth error signal.

* * * * *